United States Patent
Kondo et al.

(10) Patent No.: US 7,036,214 B2
(45) Date of Patent: May 2, 2006

(54) MANUFACTURING METHOD OF RIGID-FLEXIBLE PRINTED CIRCUIT BOARD AND STRUCTURE THEREOF

(75) Inventors: Koji Kondo, Toyohashi (JP); Satoshi Takeuchi, Nagoya (JP); Tomohiro Yokochi, Kariya (JP); Katsumi Yamazaki, Tokyo (JP); Masakazu Terada, Tokyo (JP)

(73) Assignee: Denso Corporation, Kariya (JP)

( * ) Notice: Subject to any disclaimer, the term of this patent is extended or adjusted under 35 U.S.C. 154(b) by 159 days.

(21) Appl. No.: 10/383,227

(22) Filed: Mar. 7, 2003

(65) Prior Publication Data
US 2003/0173105 A1 Sep. 18, 2003

(30) Foreign Application Priority Data
Mar. 7, 2002 (JP) ............................. 2002-062397

(51) Int. Cl.
*H05K 3/36* (2006.01)
(52) U.S. Cl. .................. 29/830; 29/825; 29/846; 29/852
(58) Field of Classification Search ............ 29/825, 29/830, 846, 852

See application file for complete search history.

(56) References Cited

U.S. PATENT DOCUMENTS

| 5,744,758 A | 4/1998 | Takenouchi et al. |
| 5,939,789 A | 8/1999 | Kawai et al. |

FOREIGN PATENT DOCUMENTS

| JP | 61-183998 A | | 8/1986 |
| JP | 4-53190 A | | 2/1992 |
| JP | 04-137591 A H | | 5/1992 |
| JP | 7-66557 | * | 3/1995 |
| JP | H7-66557 | | 3/1995 |
| JP | 10-335760 A | | 12/1998 |
| JP | P2002-305382 | | 10/2002 |

* cited by examiner

Primary Examiner—Carl J. Arbes
(74) Attorney, Agent, or Firm—Posz Law Group, PLC

(57) ABSTRACT

In a manufacturing method of a rigid-flexible printed circuit board, slits for defining two sides of a removing portion are formed in a part of plural resin films, and the plural resin films are stacked and bonded to form a circuit board. Then, a product portion is cut from the circuit board. Before the bonding, a separation sheet is disposed between predetermined adjacent layers of the plural resin films to separate the removing portion from a residual portion of the product portion. Accordingly, while the product portion is cut from the circuit board, the removing portion is separated from the product portion, because the removing portion are defined by the separation sheet, the slits, and a cutting outline of the product portion.

11 Claims, 6 Drawing Sheets

MANUFACTURING METHOD OF RIGID-FLEXIBLE PRINTED CIRCUIT BOARD AND STRUCTURE THEREOF

CROSS REFERENCE TO RELATED APPLICATION

This application relates to and incorporates herein by reference Japanese Patent Application No. 2002-62397 filed on Mar. 7, 2002.

FIELD OF THE INVENTION

The present invention relates to a rigid-flexible printed circuit board and a manufacturing method thereof. More particularly, the rigid-flexible printed circuit board is manufactured by using plural printed circuit films with slits.

BACKGROUND OF THE INVENTION

A multi-layer printed circuit board, which has different thickness in each portion, is known as a rigid-flexible printed circuit board. The rigid-flexible printed circuit board is composed of a rigid board portion and a flexible board portion. For example, the rigid board portion is composed from a five-layer printed circuit board, and is used for mounting high-density printed circuit. The flexible board portion is composed, for example, from a four-layer printed circuit board, and is flexible. The flexible board portion is made of polyimide resin, and the rigid board portion is made of epoxy resin. In a related art, the rigid board portion and the flexible board portion are formed individually. Then, the rigid board portion and the flexible board portion are bonded and electrically connected to each other so that the rigid-flexible printed circuit board is formed. This method of manufacturing the rigid-flexible printed circuit board according to the related art is very complicated, and the structure of the rigid-flexible printed circuit board is also complicated.

SUMMARY OF THE INVENTION

The present invention has an object to simplify a method of manufacturing a rigid-flexible printed circuit board. Moreover, the present invention has another object to provide a rigid-flexible printed circuit board with a simple structure.

According to the present invention, a printed circuit board is manufactured by the following method. First, a plurality of printed films, each of which includes a thermoplastic resin film and a conductive circuit formed on at least one side of the resin film, are prepared. Then, holes are formed in the resin films of the printed films, and an interlayer connection material is filled into the holes, for forming an interlayer connector for electrically connecting the conductive circuits between adjacent resin films. Further, the printed films are stacked in a stacking direction, and the resin films of the stacked printed films are bonded by heating and pressurizing so that a multi-layer printed circuit board is formed. In the method, a silt is formed in a slit forming step at a predetermined position at least in a part of the resin films of the printed films, and the silt forming step is performed before the stacking. Accordingly, in the bonding, the slit may be deformed or closed by the plastic deformation of the resin film. However, even when the slit is closed, the mechanical strength of the closed portion of the slit is decreased, and the closed portion of the slit can be readily separated by a little exterior force. Therefore, the thickness of the multi-layer printed circuit board can be partially reduced by using the slit, and a rigid-flexible printed circuit board can be readily formed. Further, in the present invention, although the slit is partially formed in the resin film of the stacked printed films, the number of the stacked printed films are the same entirely. Thus, the heating and pressurizing of the stacked printed films can be uniformly performed.

Preferably, the method further includes a cutting step for cutting a product portion from the multi-layer printed circuit board along an outline of the product portion. Further, the slit extends to have a slit length in an extending direction perpendicular to the stack direction, and the slit length is equal to or larger than a dimension of the product portion in the extending direction. In addition, the slit extends to at least the outline of the product portion in the extending direction. Therefore, the product portion has a flexibility due to the slit.

Further, a separation sheet is arranged between predetermined adjacent layers of the resin films of the stacked printed films, corresponding to a removing portion and a residual portion of the product portion, before the bonding. In this case, the separation sheet defines a surface of the removing portion, and the slit extends in the stack direction from an outer surface of the printed films to the separation sheet at two sides of the removing portion, so that the removing portion is defined by the separation sheet, the slit and the outline of the product. Therefore, the removing portion can be readily removed, and a necessary shape of the printed circuit board can be readily formed.

According to a structure of the printed circuit board of the present invention, a part of the resin films of the printed films has the slit at a predetermined position, and the slit has a length in an extending direction perpendicular to the stack direction of the printed films. Further, the length of the slit is equal to a dimension of the multi-layer printed circuit board in the extending direction. Therefore, the flexibility of the board can be effectively improved due to the slit.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

As shown in FIGS. 1A to 1H, a multi-layer printed circuit board 100 is manufactured. First, a conductive foil is formed on one side surface of a resin film 23. Then, the conductive foil on the resin film 23 is etched to have a conductive circuit 22 with a predetermined pattern so that a one-side printed film 21 is formed. In the first embodiment, for example, the conductive foil is composed of a copper foil having the thickness of 18 μm. The resin film 23 is composed of thermoplastic resin, which is made of polyether ether ketone resin (i.e., PEEK resin) and polyether imide resin (i.e., PEI resin). The weight percentage of the PEEK resin is about 35–65 wt. %, and the weight percentage of the PEI resin is about 65–35 wt. %, in accordance with the weight percentage of the PEEK resin. The thickness of the resin film 23 is about 25–75 μm.

Figure 1A:
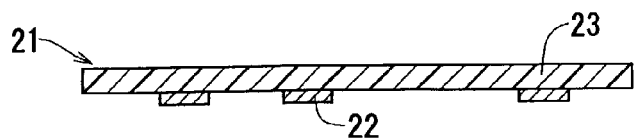
FIGS. 1A to 1H are schematic cross-sectional views explaining a method of manufacturing a multi-layer printed circuit board according to a first embodiment of the present invention.
Figure 1B:
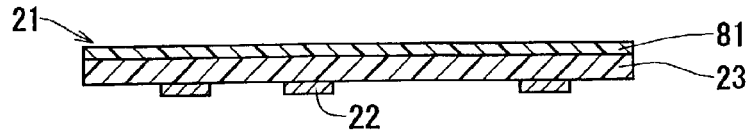

After the conductive circuit 22 is formed in FIG. 1A, as shown in FIG. 1B, a passivation film 81 (protection film) is bonded to the one-side printed film 21 on the side opposite to the conductive circuit 22 by means of a laminator and so on. The passivation film 81 is composed of a resin layer, and an adhesive layer coated on the resin layer. The adhesive layer is an ultraviolet-setting type adhesive, which is mainly made of acrylate resin. When ultraviolet rays irradiate the ultraviolet-setting type adhesive, a closslink reaction is progressed inside the ultraviolet-setting type adhesive so that the adhesion of the ultraviolet-setting type adhesive is reduced.

Figure 1C:
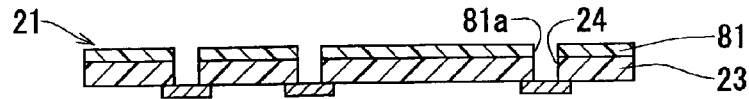

After the passivation film 81 is bonded, as shown in FIG. 1C, a carbon dioxide laser irradiates the passivation film 81 of the one-side printed film 21 so that holes 24 (via-holes) are formed in the resin film 23. Each hole 24 opened in the passivation film 81 and the resin film 23 has a closed bottom that is constructed by the conductive circuit 22. The closed bottom of the hole 24 will be used as an electrode when conductive circuits 22 are connected together, as described later. The carbon dioxide laser is controlled in its power and irradiation time so that the hole 24 is not opened in the conductive circuit 22. In this laser irradiation, an opening 81a is also formed in the passivation film 81. As shown in FIG. 1C, the opening 81a has almost the same diameter as the hole 24.

An excimer laser is also used to form the hole 24, in place of the above carbon dioxide laser. It is also possible to form the hole 24 by means of other method such as drilling. However it is preferred that laser beam drilling is used to form the hole 24 because the laser beam drilling can drill a fine hole and minimize damage to the conductive circuit 22.

Figure 1D:
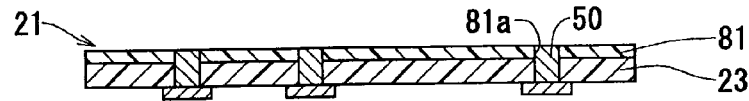

After the holes 24 in FIG. 1C are formed, as shown in FIG. 1D, a conductive paste 50 as an interlayer connection material is filled in each hole 24. In this embodiment, tin (Sn) particle of 300 grams, silver (Ag) particle of 300 grams, and terpineol of 60 grams are mixed into a paste by a mixer and the like, so that the conductive paste 50 is formed. Here, the terpineol is an organic solvent. Average diameter of the tin particle is 5 μm, and specific surface area of the tin particle is 0.5 $m^2/g$. Further, average diameter of the silver particle is 1 μm, and specific surface area of the silver particle is 1.2 $m^2/g$.

The conductive paste 50 is printed with the passivation film 81 and the resin film 23 by using a screen-stencil machine, and is stuffed from the opening 81a into the hole 24 so that the conductive paste 50 is filled in the hole 24 of the resin film 23. In place of the screen-stencil machine, a dispenser or the like may be also used to stuff the conductive paste 50 into the hole 24.

Figure 1E:
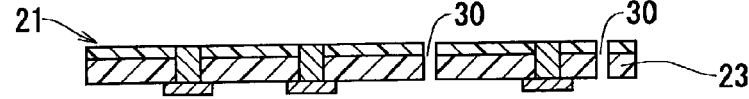

After the conductive paste 50 is filled in each hole 24, as shown in FIG. 1E, slits 30 are formed in the resin film 23 at predetermined positions. The slits 30 are used for forming a flexible board portion in the multi-layer printed circuit board 100, as described later. The slits 30 are, for example, formed by laser beam drilling in the resin film 23. A drill rooter or a punching machine may be also used for forming the slits 30. It is preferred that the breadth of each slit 30 is below 1 mm, more preferably less than the thickness of the resin film 23. Then, the plural resin films 23 are stacked to form the multi-layer printed circuit board 100, and the stacked resin films 23 are pressurized and heated. In this pressurizing and heating process, thermoplastic resin composing the resin film 23 is softened and fluidized. If the breadth of the slit 30 is wide, the thermoplastic resin is fluidized so as to stuff the slit 30, and the thermoplastic resin shifts widely in its position. In this case, the predetermined pattern of the conductive circuit 22 on the resin film 23 may be shifted, and the electric connection between the conductive circuits 22 in the multi-layer printed circuit board 100 may be lost. Therefore, it is preferred that the breadth of the slit 30 is narrow.

Figure 1F:
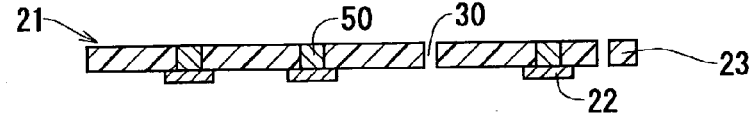

After the slits 30 are formed, ultraviolet rays irradiate the passivation film 81 by an ultraviolet source lamp (not shown). Then, the adhesive layer of the passivation film 81 is hardened so that the adhesion of the adhesive layer of the passivation film 81 is reduced. Then, the passivation film 81 is stripped and eliminated from the one-side printed film 21. As shown in FIG. 1F, the one-side printed film 21, which has the slits 30 in the resin film 23 at predetermined position and the conductive paste 50 filled in the holes 24, is prepared.

Figure 1G:
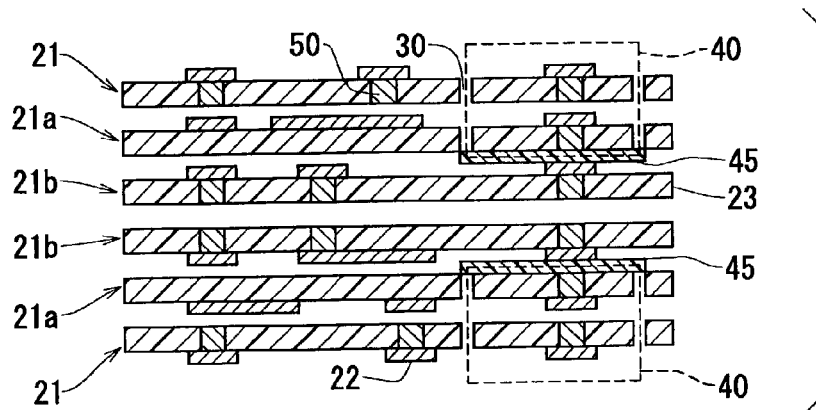

After that, plural one-side printed films are stacked together. In the first embodiment, six one-side printed films are stacked, for example. As shown in FIG. 1G, the three one-side printed films 21, 21a, 21b, which are lower three layers among the six one-side printed films, are arranged so that the conductive circuits 22 on the three one-side printed films 21, 21a, 21b are toward downside. The three one-side printed films 21, 21a, 21b, which are upper three layers among the six one-side printed films, are arranged so that the conductive circuits 22 on the three one-side printed films 21, 21a, 21b are toward upside. In other words, the third and fourth layers of the one-side printed films 21b, which are disposed at the center among the six one-side printed films, are bonded together so that the conductive circuit 22 of the third layer is opposite to the conductive circuit 22 of the fourth layer.

When plural one-side printed films 21 are stacked so that the multi-layer printed circuit board 100 is formed, a separation sheet 45 is inserted, for example, between the second layer film 21a and the third layer film 21b, as shown in FIG. 1G. Here, the second layer film 21a involves a surface of a removing portion 40 that will be removed from the multi-layer printed circuit board 100. On the other hand, the third layer film 21b defines a surface of a residual portion that is remained as a product portion of the multi-layer printed circuit board 100. The dimension of the separation sheet 45 is set to correspond to the dimension of the removing portion 40. Generally, the separation sheet 45 does not adhere to the softened thermoplastic resin even when the thermoplastic resin for forming the resin film 23 is softened in the pressurizing and heating process. Therefore, the separation sheet 45 is composed of the thermoplastic resin for forming the resin film 23, and a sheet having non-adhesive property. For example, the sheet is composed of a polyimide resin film, a fluorocarbon polymer resin film, or a metal foil such as a copper foil, a nickel foil, and a stainless foil.

The slits 30 in the resin film 23 are provided on two sides of the removing portion 40. When the six one-side printed films are stacked, the slits 30 in the two one-side printed films 21, 21a are linked to each other in the stacking direction. That is, the slits 30 in the resin films 23 are formed at the same position in the first and second one-side printed films 21, 21a. Accordingly, in the stacked films, the slits 30 are formed continuously from the first layer film 21 to the second layer film 21a so that the two sides of the removing portion 40 are formed by the slits 30.

Figure 1H:
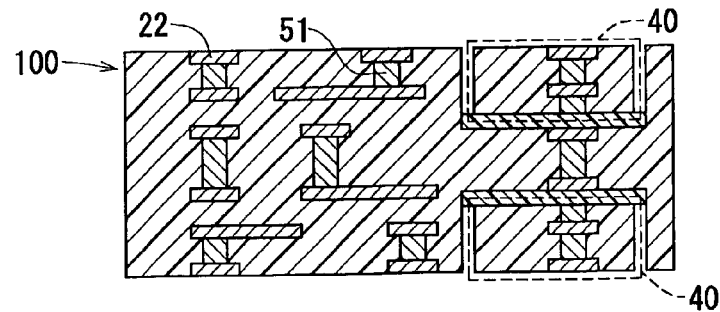

After the six one-side printed films 21, 21a, 21b are stacked, the stacked films are pressurized and heated in vacuum, so that the stacked films are pressed by upper and lower hot-press plates. The stacked films are heated up to 250–300° C., and are pressurized to 1–10 MPa for 10–20 minutes thereafter. Thereafter, as shown in FIG. 1H, the one-side printed films 21, 21a, 21b are bonded to each other. In other words, one-side printed films 21, 21a, 21b are thermo-welded together, to be integrated to each other. Moreover, in this pressurizing and heating process, the conductive paste 50 in the hole 24 is sintered and integrated, and becomes a conductive product 51. As a result, in the multi-layer printed circuit board 100, the conductive circuits 22 at different layers are connected to each other.

A mechanism of the bonding between the conductive circuits 22 at different layers is explained as follows. The conductive pastes 50 filled in the holes 24 are made of mixture of the tin particles and the silver particles. When the conductive paste 50 is heated up to 250–350° C. in the hot-pressing process, the tin particles are melted so as to cover the surfaces of the silver particles, because the melting point of the silver is 961° C. and the melting point of the tin particles is 232° C. When the conductive paste 50 is continued to heat, melted tin diffuses from the surface of the silver particles, and an alloy of silver and tin (melting point is 480° C.) is formed. In the hot-pressing process, the conductive paste 50 is also pressurized at 1–10 MPa. Therefore, the conductive product 51 is sintered, and the sintered alloy of silver and tin is formed in the hole 24.

When the conductive product 51 is formed in the hole 24, the conductive product 51 adheres to the conductive circuit 22 in the hole 24, because the conductive product 51 is pressurized. Therefore, the tin component in the conductive product 51 and the copper component in the copper foil of the conductive circuit 22 are mutually diffused in solid phase. Then, a solid diffusion layer is formed between the conductive circuit 22 and the conductive product 51, so the conductive circuit 22 and the conductive product 51 are electrically connected.

After the multi-layer printed circuit board 100 is formed as described above, the board 100 is cut to form a product portion in a cutting process.

Figure 3:
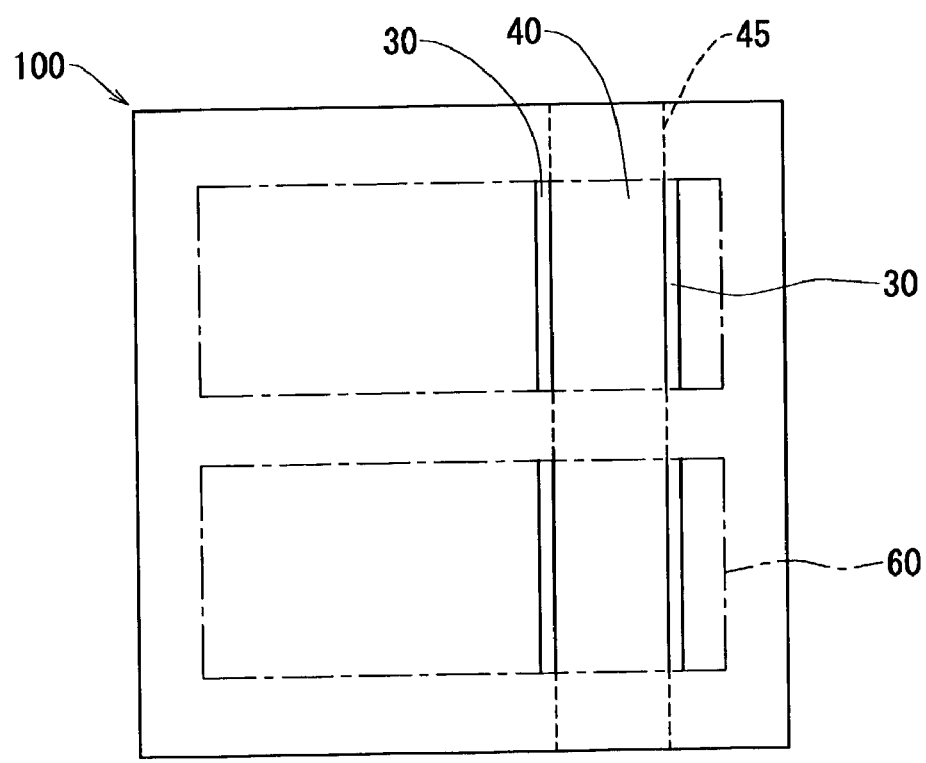
FIG. 3 is a plan view showing a state of the multi-layer printed circuit board after a hot-pressing process, according to the first embodiment.

In FIG. 3, an area, which is surrounded by a dashed line, is a product portion 60. Plural product portions 60 can be provided in the multi-layer printed circuit board 100. In the first embodiment as shown in FIG. 3, two product portions 60 are provided in the multi-layer printed circuit board 100. The product portion 60 is cut by a drill rooter, for example. The drill rooter is inserted in the stacking direction from the surface of the multi-layer printed circuit board 100. Then, the drill rooter is moved along the outline of the product portion 60 so that the product portion 60 is obtained by cutting. A punching machine may be also used to cut the product portion 60 from the multi-layer printed circuit board 100.

The slits 30 are formed along the lateral direction of the product portion 60, and the length of each slit 30 is equal to or larger than the width of the product portion 60. The slits 30 are provided at two sides of the removing portion 40 so that each slit 30 in the longitudinal direction extends at least to the outline of the product portion 60. Also, the separation sheet 45 is inserted between the removing portion 40 and the residual portion of the product portion 60, which is remained as a product. Therefore, after performing the cutting process, the removing portion 40 is isolated from the product portion 60 because the four sidewalls of the removing portion 40 are isolated by the slits 30 and the cutting surfaces of the product portion 60. Further, the bottom of the removing portion 40 is separated from the product portion 60 by the separation sheet 45. Accordingly, while the product portion 60 is cut from the multi-layer printed circuit board 100, the removing portion 40 is simultaneously removed from the product portion 60.

As shown in FIG. 3, the separation sheet 45 is formed to sufficiently cover the removing portions 40 for the adjacent product portions 60. Therefore, one separation sheet 45 can be used to separate plural removing portions 40, for the adjacent product portions 60.

Here, because the slit 30 is terminated before the end of the slit 30 reaches to the peripheral surface of the resin film 23, the resin film 23 is not separated by the slits 30 even in a single-layer film 23.

Figure 2:
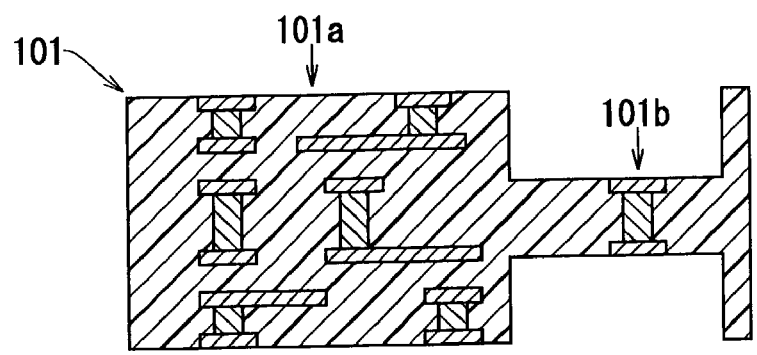
FIG. 2 is a cross-sectional view showing a state of the multi-layer printed circuit board after a cutting process, according to the first embodiment.

The product portion 60 is cut from the multi-layer printed circuit board 100, and the removing portion 40 is removed from the product portion 60 simultaneously. Then, a rigid-flexible printed circuit board 101 is accomplished. As shown in FIG. 2, the rigid-flexible printed circuit board 101 is composed of a rigid board portion 110a and a flexible board portion 101b. The rigid board portion 101a is composed of a six-layer printed circuit board, and is used for mounting high-density printed circuit and the like. The flexible board portion 101b is composed of a double-layer printed circuit board, and is flexible.

As shown in FIGS. 1H and 3, the slits 30 are formed along the two side surfaces of the removing portion 40. Actually, the slits 30 of the resin film 23 may be deformed while the multi-layer printed circuit board 100 is formed. For example, the slits 30 become narrow or are closed while the thermoplastic resin composing the resin film 23 is softened and fluidized in the hot-pressing process. However, even when the slits 30 are closed, the closed slits 30 can be separated by a small amount of force because of the characteristics of the thermoplastic resin. When the slits 30 are once formed in the resin film 23, the mechanical strength of the resin film 23 at the positions of the slits 30 is reduced. When the resin film 23 is made of crystalline thermoplastic resin, the closed slits 30 can be readily separated with a little force. In the first embodiment, the resin film 23 is made of the PEEK resin and the PEI resin, which are crystalline thermoplastic resins. Besides, other crystalline thermoplastic resin such as crystal polymer may be also used as the material for forming the resin film 23. Moreover, even polyethylene terephthalate (i.e., PET) resin or polyphenylene sulfide (i.e., PPS) resin, which are non-crystalline thermoplastic resin but are oriented by stretching, also has the similar characteristics to the crystalline thermoplastic resin. When the slit 30 is formed in the resin film 23 made of PET resin or PPS resin, an orientation of the resin film 23 around the slit 30 is destroyed. Therefore, after that, even when the slit 30 is closed, a small amount of exterior force can separate the closed slit 30 because the orientation of the resin film 23 is destroyed.

According to the above method of manufacturing the rigid-flexible printed circuit board 101, the stacked films composed of the six one-side printed films 21, 21a, 21b is heated and pressed in the hot-pressing process before the cutting process in which the removing portion 40 is separated from the product portion 60. Therefore, after the hot-pressing process, the conductive circuits 22 on the one-side printed films 21 in the stacked film are not substantially shifted from each other, and are almost placed at the same position on entire surface, because heating and pressurizing in the hot-pressing process are uniformly applied to the entire stacked films. As a result, the adhesive strength between the one-side printed films 21, 21a, 21b is stabilized uniformly, the conductive circuits 22 are prevented from shifting, and the reliability of the bonding between the one-side printed films 21, 21a, 21b is improved by the manufacturing method of the first embodiment.

In the first embodiment, the removing portion 40 and the residual portion of the product portion 60 are separated using the separation sheet 45. However, when the separation sheet 45 is inserted between the second layer one-side printed film 21a and the third layer one-side printed film 21b, the thickness of the multi-layer printed circuit board 100 in the removing portion 40 is thicker than that in the other portion of the removing portion 40 by the thickness of the separation sheet 45. In this case, the thickness of the separation sheet 45 is about 20 μm. Therefore, the difference between the thickness in the removing portion 40 and the thickness in the other portion of the removing portion 40 is slight. It is preferred that the thickness of the multi-layer printed circuit board 100 is substantially uniformed through the entire board so that heating and pressurizing in the hot-pressing process are homogeneously applied to the entire stacked films.

Figure 4:
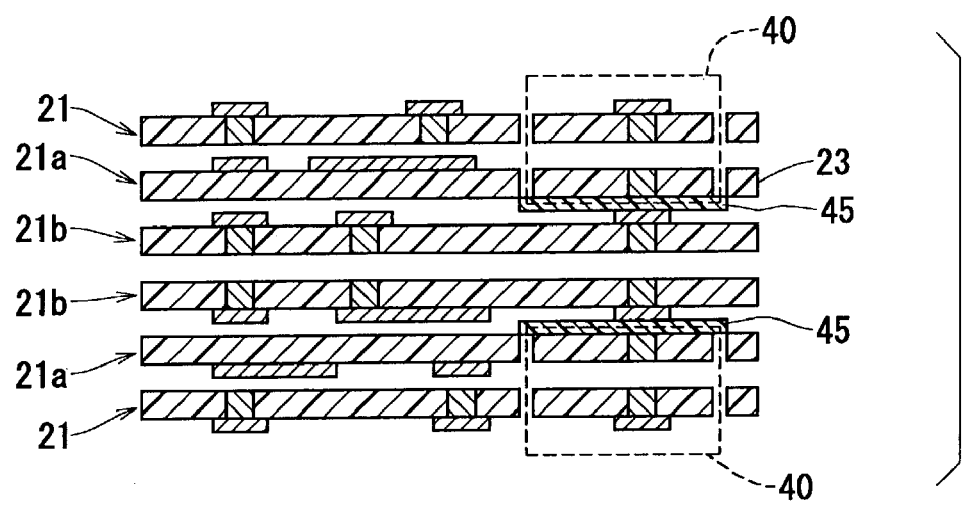
FIG. 4 is a cross-sectional view showing a multi-layer printed circuit board according to a modification of the first embodiment.

In this aspect, the first embodiment can be modified as shown in FIG. 4. That is, the conductive circuit 22 on one-side printed film in the removing portion 40 is removed, so that the thickness of the separation sheet 45 is cancelled, and the thickness of the stacked films is substantially uniformed through the entire stacked films. The thickness of the separation sheet 45 is 20 μm, and the thickness of the conductive circuit 22 is 18 μm. Therefore, in FIG. 4, one layer of the conductive circuit 22 is removed. Specifically, the conductive circuits 22 on the second and fifth layer one-side printed films 21a in the removing portion 40 is removed so that the thickness of the stacked films is almost uniformed through the entire stacked films.

Figure 5:
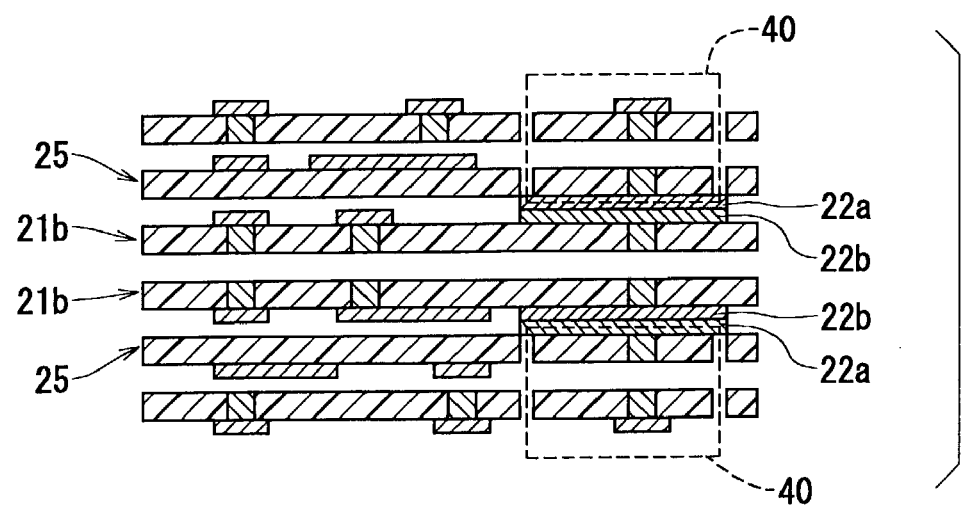
FIG. 5 is a cross-sectional view showing a multi-layer printed circuit board according to another modification of the first embodiment.

The removing portion 40 is separated from the residual portion of the product portion 60 by the separation sheet 45. However, using the conductive circuit 22, the removing portion 40 can be separated from the residual portion of the product portion 60. As shown in FIG. 5, the conductive circuits 22b are formed in the residual portion of the product portion 60 on the upper side of the third layer one-side printed film 21b and on the lower side of the fourth layer one-side printed film 21b. On the other hand, the conductive circuits 22a are also formed in the removing portion 40 on the lower side of the second layer film 25 and on the upper side of the fifth layer film 25. In this case, the conductive circuits 22a, 22 are formed on both sides of the film 25, respectively. That is, the film 25 is a both-side printed film 25. The conductive circuits 22a on the second and fifth layer both-side printed films 25 and the printed circuits 22b on the third and fourth layer one-side printed films 21b are not bonded to each other in the hot-pressing process, because the heating temperature in the hot-pressing process is about 250–350° C. that is lower than the melting temperature of the conductive circuits 22a, 22b. Therefore, when the product portion 60 is cut in the cutting process, the conductive circuits 22a, 22b are readily separated from each other so that the removing portion 40 is readily separated from the residual portion of the product portion 60. This modification using the both-side printed film 25 can be suitably used for the case where plural removing portions 40 are positioned to scatter in the product portion 60 or the case where the positions of removing portions 40 are different relative to the product portions 60. The conductive circuits 22a, 22b provided on the both-side printed films can be formed precisely at predetermined positions, as compared with the separation sheet 45.

(Second Embodiment)

Figure 6A:
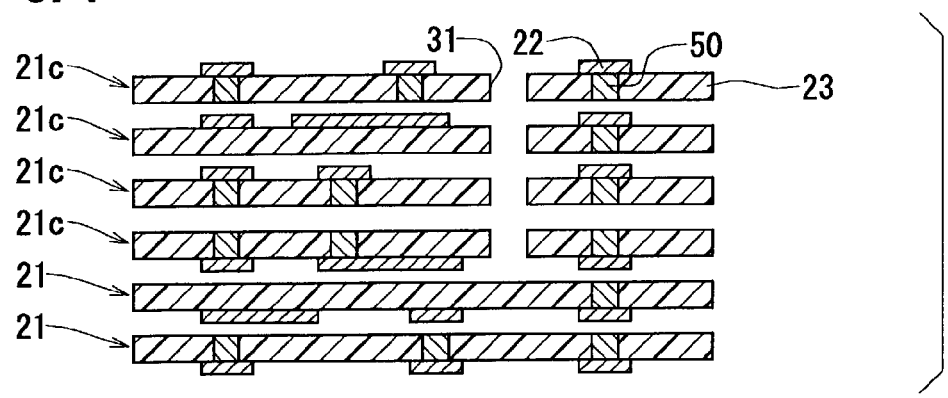
FIGS. 6A and 6B are schematic cross-sectional views showing a part of manufacturing steps of a multi-layer printed circuit board according to a second embodiment of the present invention.

In the second embodiment, as shown in FIG. 6A, plural one-side printed films 21, 21c are stacked to form stacked films, similar to the first embodiment. The one-side printed films 21,21c are formed by the same manner as the first embodiment. However, the two one-side printed films 21 do not have a slit, and the four one-side printed films 21c have slits 31 that are positioned at the same position in the films 21c. No separation sheet is inserted between the one-side printed films 21, 21c.

Figure 6B:
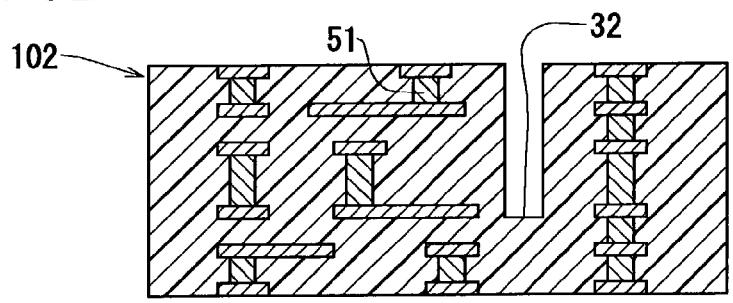
Figure 7:
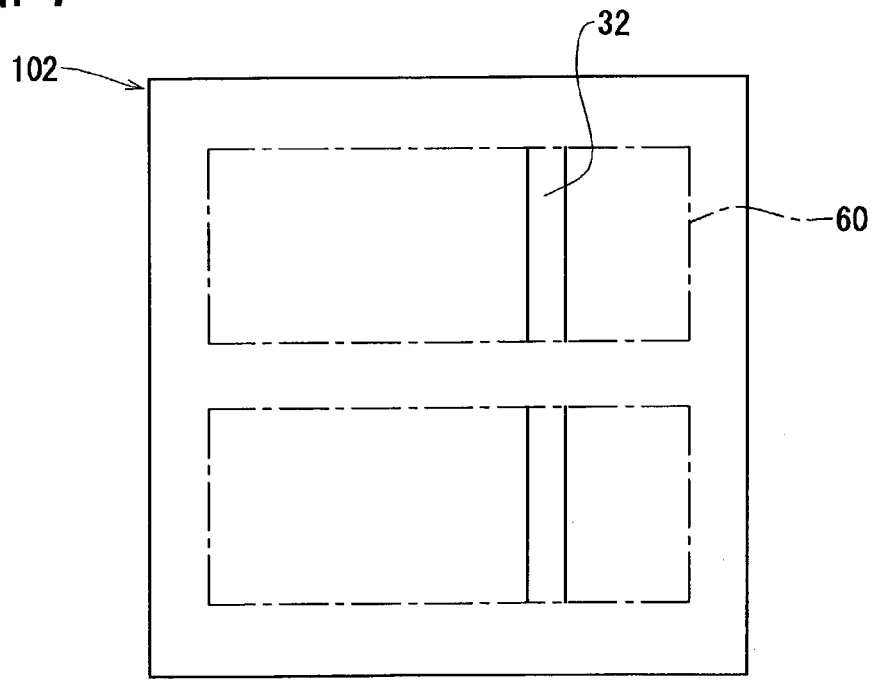
FIG. 7 is a plan view showing a state of the multi-layer printed circuit board after the hot-pressing process, according to the second embodiment.

After the six one-side printed films 21, 21c are stacked to form the stacked films, a linked slit 32 with a predetermined width is formed in the first to fourth layer one-side printed films 21c. Then, the stacked films are pressurized and heated in vacuum. Therefore, as shown in FIG. 6B, the one-side printed films 21, 21c are bonded to each other. Moreover, in this pressurizing and heating process, a conductive paste 50 in the hole 24 is sintered and integrated to form a conductive product 51. As a result, the multi-layer printed circuit board 102 is formed. After that, as shown in FIG. 7, a product portion 60 is cut from the multi-layer board 102, so that a rigid-flexible printed circuit board is formed. In the second embodiment, the linked slit 32 is formed along the width of the product portion 60, and the thickness of the rigid-flexible printed circuit board at the linked slit 32 is thin. Therefore, the rigid-flexible printed circuit board bends at the linked slit 32. The width of the linked slit 32 is determined such that two edges of the linked slit 32 in the rigid-flexible printed circuit board do not contact when the rigid-flexible printed circuit board bends at the linked slit 32.

Figure 8:
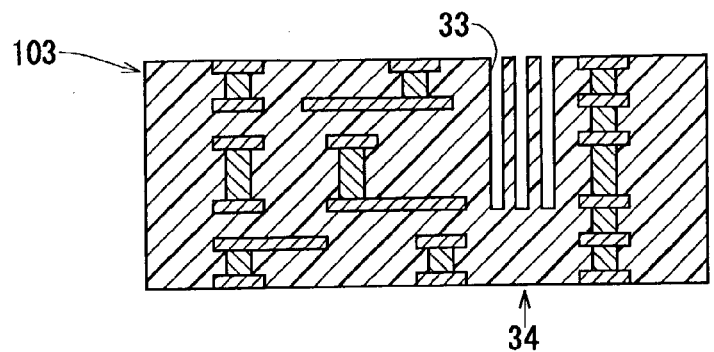
FIG. 8 is a cross-sectional view showing a multi-layer printed circuit board according to a modification of the second embodiment.

In the second embodiment, only one linked slit 32 with a predetermined width is formed. However, as shown in FIG. 8, plural slits 34, which are composed of plural slits 33 with narrow width, can be also formed, so that the rigid-flexible printed circuit board bends at the slits 34. The rigid-flexible printed circuit board is sufficiently flexible because of the plural slits 34.

(Third Embodiment)

Figure 9A:
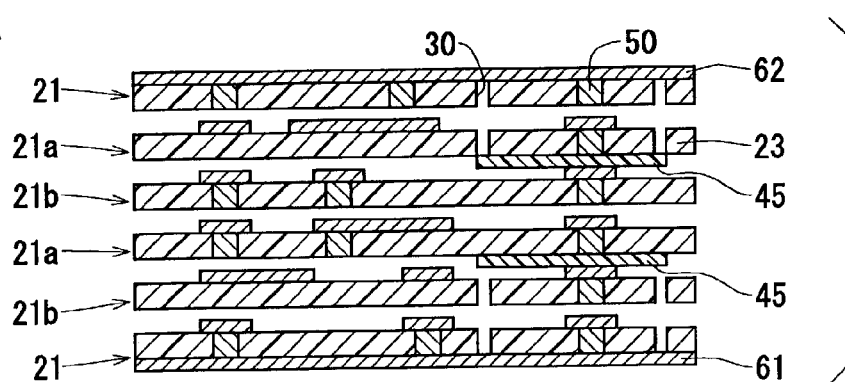
FIGS. 9A to 9C are schematic cross-sectional views showing a part of manufacturing steps of a multi-layer printed circuit board according to a third embodiment of the present invention.

At first, the one-side printed film 21 is prepared in the same manner as the first embodiment. After the passivation film 81 is stripped and eliminated from the one-side printed film 21, plural one-side printed films 21, 21a, 21b are stacked integrally, as shown in FIG. 9A. For example, six one-side printed films 21, 21a, 21b are stacked. In the first layer, a copper foil 62 is formed on the top surface of the one-side printed film 21. In the second layer, the conductive circuit 22 is formed on the top surface of the one-side printed film 21a and the separation sheet 45 is formed on the bottom surface of the one-side printed film 21a. In the third layer, the conductive circuit 22 is formed on the top surface of the one-side printed film 21b. In the fourth layer, the conductive circuit 22 is formed on the top surface of the one-side printed film 21a and the separation sheet 45 is formed on the bottom surface of the one-side printed film 21a. In the fifth layer, the conductive circuit 22 is formed on the top surface of the one-side printed film 21b. In the sixth layer, the conductive circuit 22 is formed on the top surface of the one-side printed film 21 and a copper foil 61 is formed on the bottom surface of the one-side printed film 21. The two slits are formed in the first, second, fifth, and sixth layers of the one-side printed films 21, 21a, 21b, respectively.

Figure 9B:
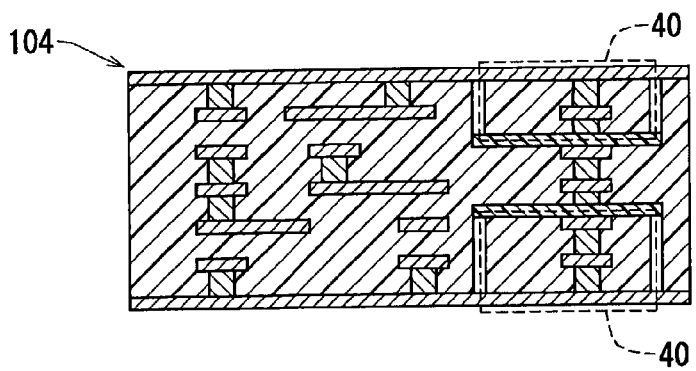

As shown in FIG. 9B, after the six one-side printed films 21, 21a, 21b are stacked to form stacked films, the stacked films are pressurized and heated in vacuum. Therefore, the one-side printed films 21, 21a, 21b are bonded to each other. That is, the one-side printed films 21, 21a, 21b are integrated by thermo-welding. Moreover, in this pressurizing and heating, the conductive paste 50 in the holes 24 is sintered and integrated to form the conductive product 51. As a result, the multi-layer printed circuit board 104 is formed. Thereafter, the copper foils 61, 62 are etched with predetermined patterns so that conductive circuits 63, 64 are formed.

Figure 9C:
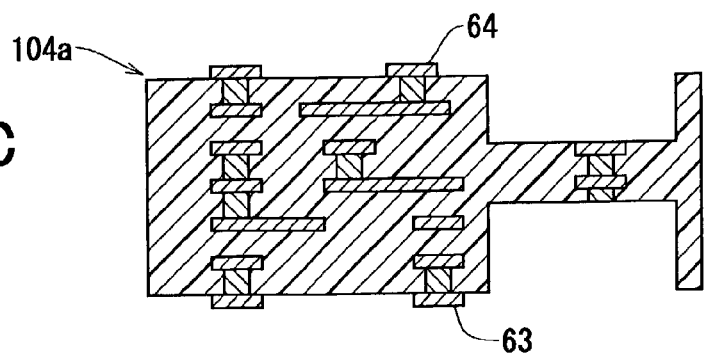

Then, the multi-layer printed circuit board 104 is cut to form the product portion 60 in the cutting process, similar to the first embodiment. The removing portion 40 is isolated from the product portion 60, because the slits 30 are provided to enclose the four sidewalls of the removing portion 40 and the separation sheet 45 separates the bottom of the removing portion 40 from the product portion. When the product portion 60 is cut down from the multi-layer printed circuit board 104, the removing portion 40 is simultaneously eliminated from the product portion 60. As a result, a rigid-flexible printed circuit board 104a is formed, as shown in FIG. 9C. In the third embodiment, the rigid-flexible printed circuit board 104a has conductive circuits 63, 64 on two sides of the rigid-flexible printed circuit board 104a.

(Fourth Embodiment)

Figure 10A:
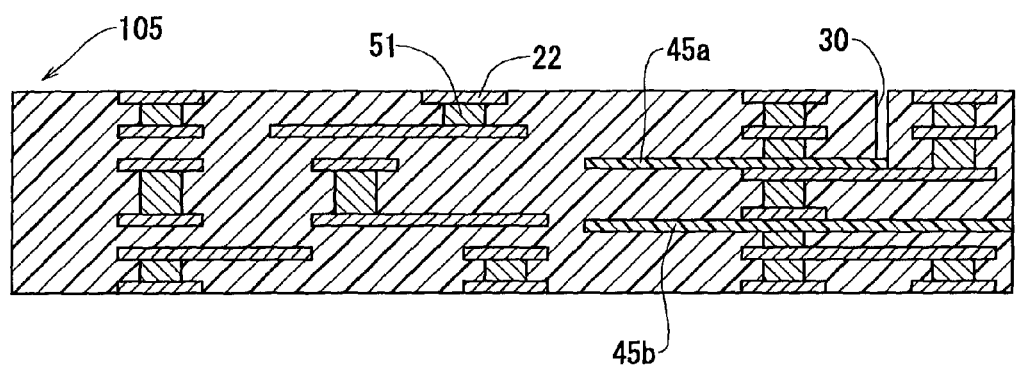
FIGS. 10A and 10B are schematic cross-sectional views showing a part of manufacturing steps of a multi-layer printed circuit board according to a fourth embodiment of the present invention.
Figure 10B:
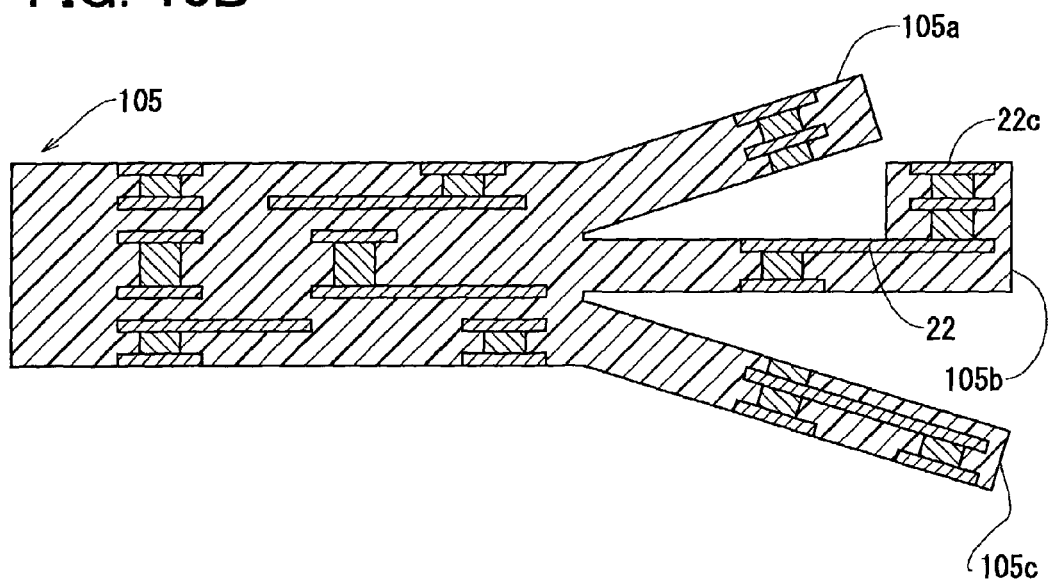

As shown in FIGS. 10A and 10B, a multi-layer printed circuit board 105 is prepared in the same manner as the first embodiment. However, in the fourth embodiment, separation sheets 45a, 45b are inserted into the multi-layer printed circuit board 105 at predetermined positions so that the edge portion of the multi-layer printed circuit board 105 can be separated into three parts 105a, 105b, 105c. For example, the edge of the separation sheet 45a, which is disposed upper side in the multi-layer printed circuit board 105, is not extended to the sidewall of the multi-layer printed circuit board 105, but is terminated at a predetermined position at which the slit 30 is formed. The slit 30 is provided to extend from the top surface of the multi-layer board 105 to the separation sheet 45a. The separation sheet 45b, which is disposed lower side in the multi-layer printed circuit board 105, is extended to the sidewall of the multi-layer printed circuit board 105.

Then, the board 105 is cut to form a product portion in the cutting process. When the product portion is cut from the board 105, the edge portion of the board 105 is separated into three separated parts 105a, 105b, 105c by the separation sheets 45a, 45b.

In the fourth embodiment, the slit 30 has a length in a width direction of the board 105, and the length of the slit 30 is equal to or larger than the width of the product portion. The slit 30 defines the edge of the separated part 105a, and the separated part 105b is formed into a L-shape. A conductive circuit land 22c is disposed at the edge of the separated part 105b. The conductive circuit land 22c formed in the separated part 105b is used for detecting the electric connection between the printed circuits. In other words, the electric connection is checked easily using the conductive circuit land 22c. The electric connection in the separated parts 105a, 105c are readily checked respectively, because the conductive circuits 22 in the separated parts 105a, 105c are exposed outside.

Moreover, it is possible to form both the separated parts 105b, 105c into L-shape. In this case, the electric connection is more readily checked.

Further, the conductive circuit land 22c may be used as a connector for connecting other device. Also after the check of the electric connection, some separated parts are cutoff. In this case, the remained separated part may be used as a connector for connecting other device.

(Modifications)

Although the present invention has been fully described in connection with the preferred embodiments thereof with reference to the accompanying drawings, it is to be noted that various changes and modifications will become apparent to those skilled in the art.

For example, in the above-described embodiments, the slit 30 is formed continuously along the lateral direction of the product portion 60. However, intermittent slits may be formed for separating the removing portion 40 from the product portion 60. The intermittent slits such as a dotted line can be formed in the resin film 23 intermittently along the lateral direction of the product portion 60. When the product portion 60 is cut from the multi-layer printed circuit board, the removing portion 40 is simultaneously separated from the product portion 60 by a small force due to the intermittent slits.

Although the conductive circuit is formed by etching of the copper foil on the resin film 23, the conductive circuit may be also formed by printing the circuit pattern by screen-stencil machine. In this case, the conductive paste 50 may be filled in the holes 24 of the resin films 23, simultaneously in the printing.

In the above-described embodiment, the resin film is made of PEEK resin of 35–65 wt. % and PEI resin of 65–35 wt. %. However, the resin film may be made of other thermoplastic resin, such as mixture of PEEK resin, PEI resin, and non-conductive filler. It is preferred that the resin film may be made of heat-resistant thermoplastic resin, which has a heat-resistance in soldering process or the like and adheres together in the hot-pressing process.

In the above-described embodiment, the interlayer connection material is composed of conductive paste with metallic particles of silver alloy. However, other metallic particles such as solder ball may be used.

Although the multi-layer printed circuit board is composed of the one-side printed film, the both-side printed film may be used for the multi-layer printed circuit board. In this case, plural both-side printed films are prepared and stacked to each other. Further, a both-side printed film may be sandwiched by two one-side printed films.

Such changes and modifications are to be understood as being within the scope of the present invention as defined by the appended claims.

What is claimed is:

1. A method of manufacturing a printed circuit board, comprising:
   preparing a plurality of printed films, each of which includes a thermoplastic resin film and a conductive circuit formed on at least one side of the resin film;
   forming holes in the resin films of the printed films;
   filling an interlayer connection material into the holes, for forming an interlayer connector for electrically connecting the conductive circuits between adjacent resin films;
   stacking the printed films in a stacking direction;
   bonding the resin films of the stacked printed films by heating and pressurizing, so that a multi-layer printed circuit board is formed;
   forming a silt at a predetermined position at least in a part of the resin films of the printed films, the forming the slit performed before the stacking;
   cutting a product portion from the multi-layer printed circuit board along an outline of the product portion; and
   arranging a separation sheet between predetermined adjacent layers of the resin films of the stacked printed films, corresponding to a removing portion and a residual portion of the product portion, before the bonding, wherein:
   the slit extends to have a slit length in an extending direction perpendicular to the stack direction, the slit length being equal to or larger than a dimension of the product portion in the extending direction;
   the slit extends to at least the outline of the product portion in the extending direction;
   the separation sheet is arranged to define a surface of the removing portion; and
   the slit extends in the stack direction from an outer surface of the printed films to the separation sheet, at two sides of the removing portion, so that the removing portion is defined by the separation sheet, the slit and the outline of the product.

2. A method of manufacturing a printed circuit board according to claim 1, wherein, in the slit-forming step, the slit is formed continuously at the predetermined position, at least in the part of the resin films.

3. A method of manufacturing a printed circuit board according to claim 1, wherein, in the slit-forming step, the slit is formed intermittently at the predetermined position, at least an the part of the resin films.

4. A method of manufacturing a printed circuit board according to claim 1,
   wherein the conductive circuit positioned in the removing portion is substantially eliminated by a thickness of the separation sheet in the preparing, so that a thickness of the stacked printed films in the removing portion is approximately equal to a thickness of the stacked printed films in the other portion of the removing portion.

5. A method of manufacturing a printed circuit board according to claim 1,
   wherein the separation sheet includes a sheet portion having a non-adhesive property with the thermoplastic resin.

6. A method of manufacturing a printed circuit board according to claim 1, wherein:
   in the cutting, the multi-layer printed circuit board is cut for forming a plurality of product portions; and
   the separation sheet extends to cover each removing portion for the product portions.

7. A method of manufacturing a printed circuit board, comprising:
   preparing a plurality of printed films, each of which includes a thermoplastic resin film and a conductive circuit formed an at least one side of the resin film;
   forming holes in the resin films of the printed films;
   filling an interlayer connection material into the holes, for forming an interlayer connector for electrically connecting the conductive circuits between adjacent resin films;
   stacking the printed films in a stacking direction;
   bonding the resin films of the stacked printed films by heating and pressurizing, so that a multi-layer printed circuit board is formed;
   a slit forming step for forming a silt at a predetermined portion at least in a part of the resin films of the printed films, and the silt forming step is performed before the stacking; and
   cutting a product portion from the multi-layer printed circuit board along an outline of the product portion, wherein:
   the slit extends to have a slit length in an extending direction perpendicular to the stack direction, the slit length being equal to or larger than a dimension of the product portion in the extending direction; and
   the slit extends to at least the outline of the product portion in the extending direction;
   in the stacking, the printed films are stacked such that the conductive circuits between predetermined adjacent layers on the resin films contact to have a contact surface on which a removing portion is removed from a residual portion of the product portion;
   the contact surface is arranged to define a surface of the removing portion; and
   the slit extends in the stack direction from an outer surface of the printed films to the contact surface, at two sides of the removing portion, so that the removing portion is defined by the contact surface, the slit and the outline of the product.

8. A method of manufacturing a printed circuit board according to claim 7, wherein the conductive circuits on the contact surface is made of copper.

9. A method of manufacturing a printed circuit board comprising:
   preparing a plurality of printed films, each of which includes a thermoplastic resin film and a conductive circuit formed on at least one side of the resin film;
   forming holes in the resin films of the printed films;
   filling an interlayer connection material into the holes, for forming an interlayer connector for electrically connecting the conductive circuits between adjacent resin films;
   stacking the printed films in a stacking direction;
   bonding the resin films of the stacked printed films by heating and pressurizing, so that a multi-layer printed circuit board is formed;
   a slit forming step for forming a silt at a predetermined position at least in a part of the resin films of the printed films, and the silt forming step is performed before the stacking; and
   cutting a product portion from the multi-layer printed circuit board along an outline of the product portion;

arranging a separation sheet between predetermined adjacent layers of the resin films of the stacked printed films before the bonding, so that an edge area of the product portion is separated by the separation sheet into first and second parts in the product portion after the product portion is cur from the multi-layer printed circuit board, wherein:

the slit extends from an outer surface of the printed films to the separation sheet in the stacking direction of the printed films to be substantially perpendicular to the separation sheet; and the first part and the second part are separated by the slit and the separation sheet after the cutting, so that one of the first part and the second part has an approximate L-shape.

10. A method of manufacturing a printed circuit board, comprising:

preparing a plurality of first printed films, each of which in includes a resin film and a conductive circuit farmed at lest one side of the resin film;

preparing a plurality of second printed films, each of which includes the resin film and a conductive circuit formed at least one side of the resin film;

forming holes in the resin films of the first and second printed films;

filling an interlayer connection material into the holes, for forming an interlayer connector for electrically connecting the connective circuits between adjacent resin films;

forming a silt penetrating trough the resin film at a predetermined position in each first printed film;

stacking the first printed films and the second printed films in a stack direction such that at least two of the first printed films are adjacent to each other in the stacking direction; and bonding the resin films of the stacked first and second printed films by heating and pressurizing, so that a multi-layer printed circuit board is formed, wherein:

in the stacking, the slits of the at least two resin films of the first printed films are linked with each other at the predetermined position;

in the stacking, the first printed films are positioned outside of the second printed films in the stack direction, the method further comprising removing a removing portion from the multi-layer printed circuit by using the slits, for forming a product portion.

11. A method of manufacturing a printed circuit board according to claim 10, further comprising:

arranging a separation sheet between two resin films of adjacent first and second printed films for defining the removing portion, wherein the separation sheet is disposed to cover an entire surface of the removing portion.

* * * * *